United States Patent
Vincent et al.

(10) Patent No.: US 10,529,670 B2
(45) Date of Patent: Jan. 7, 2020

(54) SHIELDED PACKAGE WITH INTEGRATED ANTENNA

(71) Applicant: NXP USA, Inc., Austin, TX (US)

(72) Inventors: Michael B. Vincent, Chandler, AZ (US); Gregory J. Durnan, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/259,396

(22) Filed: Jan. 28, 2019

(65) Prior Publication Data

US 2019/0157216 A1 May 23, 2019

Related U.S. Application Data

(62) Division of application No. 15/199,838, filed on Jun. 30, 2016, now Pat. No. 10,236,260.

(51) Int. Cl.
| | |
|---|---|
| *H01L 23/552* | (2006.01) |
| *H01L 23/00* | (2006.01) |
| *H01L 21/48* | (2006.01) |
| *H01L 21/56* | (2006.01) |
| *H01L 21/78* | (2006.01) |
| *H01L 23/31* | (2006.01) |

(Continued)

(52) U.S. Cl.
CPC .......... *H01L 23/552* (2013.01); *H01L 21/485* (2013.01); *H01L 21/4853* (2013.01); *H01L 21/4867* (2013.01); *H01L 21/56* (2013.01); *H01L 21/78* (2013.01); *H01L 23/3114* (2013.01); *H01L 23/49838* (2013.01); *H01L 23/66* (2013.01); *H01L 24/96* (2013.01); *H01L 24/97* (2013.01); *H01L 21/568* (2013.01); *H01L 2223/6677* (2013.01); *H01L 2224/04105* (2013.01); *H01L 2224/12105* (2013.01); *H01L 2224/24137* (2013.01); *H01L 2224/24195* (2013.01); *H01L 2924/141* (2013.01); *H01L 2924/143* (2013.01); *H01L 2924/1434* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01)

(58) Field of Classification Search
None
See application file for complete search history.

(56) References Cited

U.S. PATENT DOCUMENTS

2013/0292808 A1* 11/2013 Yen ........................ H01L 23/552
257/660

* cited by examiner

*Primary Examiner* — Daniel Whalen

(57) ABSTRACT

A semiconductor structure includes a packaged semiconductor device having at least one device, a conductive pillar, an encapsulant over the at least one device and surrounding the conductive pillar, wherein the conductive pillar extends from a first major surface to a second major surface of the encapsulant, and is exposed at the second major surface and the at least one device is exposed at the first major surface. The packaged device also includes a conductive shield layer on the second major surface of the encapsulant and on minor surfaces of the encapsulant and an isolation region at the second major surface of the encapsulant between the encapsulant and the conductive pillar such that the conductive shield layer is electrically isolated from the conductive pillar. The semiconductor structure also includes a radio-frequency connection structure over and in electrical contact with the conductive pillar at the second major surface of the encapsulant.

18 Claims, 11 Drawing Sheets

(51) Int. Cl.
*H01L 23/498* (2006.01)
*H01L 23/66* (2006.01)

SHIELDED PACKAGE WITH INTEGRATED ANTENNA

BACKGROUND

Field

This disclosure relates generally to semiconductor devices, and more specifically, to shielded packages with radio frequency components with integrated antenna.

Related Art

Packaged semiconductor devices with one or more radio frequency (RF) components and circuitry are typically connected to a printed circuit board (PCB) to allow an antenna to be either connected to the PCB by a connector or as an integral part of the board. With either option, the antenna takes up valuable space on the PCB board. Additionally, the RF component(s) are shielded from electromagnetic interference for proper performance as well as to meet Federal Communication Commission (FCC) regulations. Normally, a shield constructed of metal is attached to the PCB board over and around the RF module. Space between the shield and the components takes up space on the board and unnecessarily increases the volume of the device. Additionally, because the shield and antenna are not an integral part of the device, the device cannot be offered to the customer as certified by the FCC and ready to be used. Customers have to add the shield and the antenna once the device is received from a supplier, and then seek FCC approval for the assembled product.

Packaged semiconductor devices with single or multiple processing chips can have multiple functions and form highly integrated systems. To accomplish this, the packaging can be three dimensional with high component density and effective thermal management. In some applications, the packaged devices are used in portable and even wearable devices with wireless communication capability. To continue decreasing the packaged devices to fit small volume applications, efficient integration of antennas and shielding is important.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of semiconductor structures and methods disclosed herein provide integrated assemblies with one or more packaged semiconductor devices that include radio frequency (RF) components with electro-magnetic interference (EMI) shielding and an antenna. The EMI shield is isolated from an interconnect structure. An antenna connector or substrate comprising an antenna can be directly attached to the external surface of the EMI shield. The interconnect structure allows electrical connection of the connector or antenna feed while being isolated from the surrounding grounded shield. The completed assembly may be certified by the FCC by the supplier, alleviating the need for individual customers to install an EMI shield around RF components, along with an antenna, and then seek FCC approval for the assembly.

Figure 1:
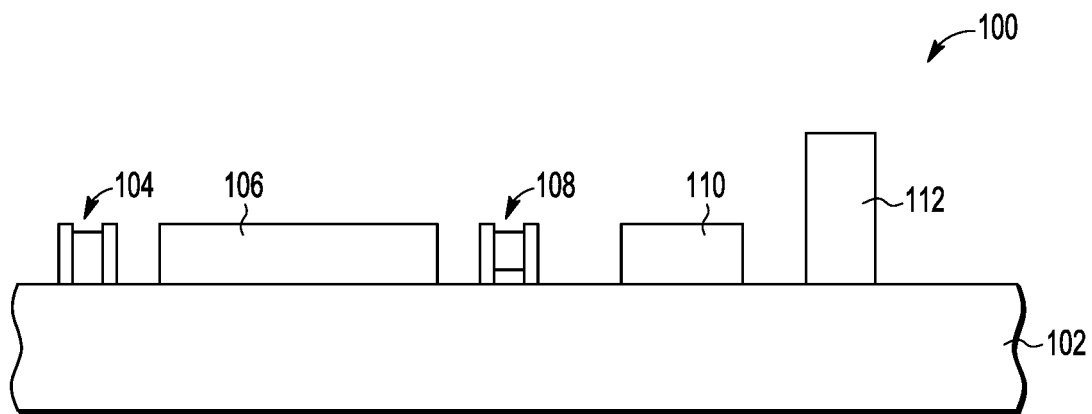
FIG. 1 is a side cross-sectional view of an embodiment of a packaged semiconductor device during an intermediate stage of fabrication.

FIG. 1 is a side cross-sectional view of an embodiment of a packaged semiconductor device 100 during an intermediate stage of fabrication in which substrate 102 is shown with passive components 104, 108, active components 106, 110, and conductive pillar 112 mounted or formed on a first major surface of substrate 102. Substrate 102 can be an unsingulated semiconductor wafer in which wafer level packaging or other suitable technology is used to assemble and package device 100. Passive components 104, 108 can include heat sink elements, resistors, capacitors, magnetic (inductive) devices, memristors, transducers, sensors, and/or detectors, among others. Active components 106, 110 can include analog and/or digital integrated circuits for various processing functions and/or memory, power sources, and other suitable components. Other suitable active and passive components 104, 106, 108, 110 can be included in device 100 in addition to or instead of the components shown in FIG. 1. Conductive pillar 112 can be made of copper or other electrically conductive material that is formed or mounted on substrate 102. Conductive pillar 112 can also be referred to as a pre-placed via.

Figure 2:
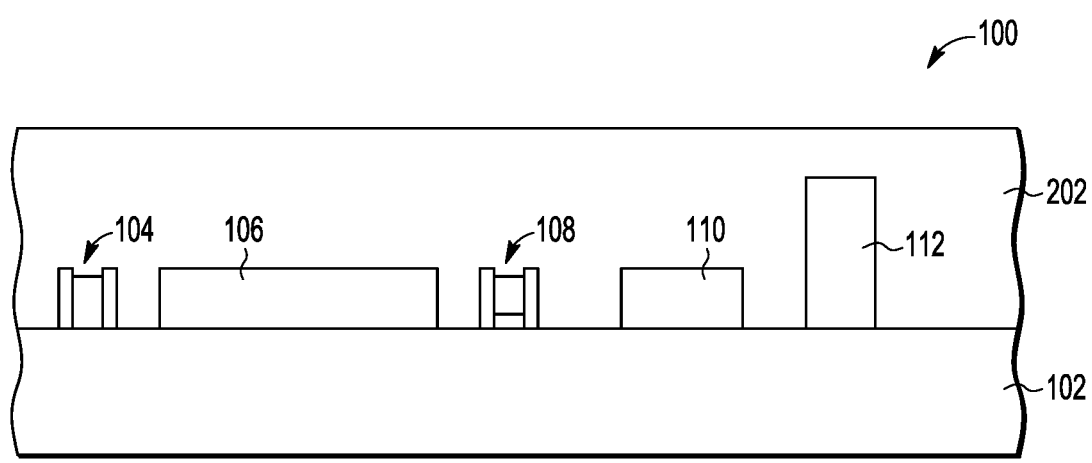
FIG. 2 is a side cross-sectional view of the packaged semiconductor device of FIG. 1 during a subsequent stage of fabrication.

FIG. 2 is a side cross-sectional view of the packaged semiconductor device 100 of FIG. 1 during a subsequent stage of fabrication in which encapsulating material 202 is deposited over and around components on substrate 102 including active and passive components 104, 106, 108, 110 and conductive pillar 112. Encapsulating material 202 can include epoxy and/or other material that is formulated to help protect components on substrate 102 from damage and corrosive environments. Depending on the mold compound used, encapsulating material 202 is then cured using heat, ultraviolet light, over time, or by any other suitable method.

Figure 3:
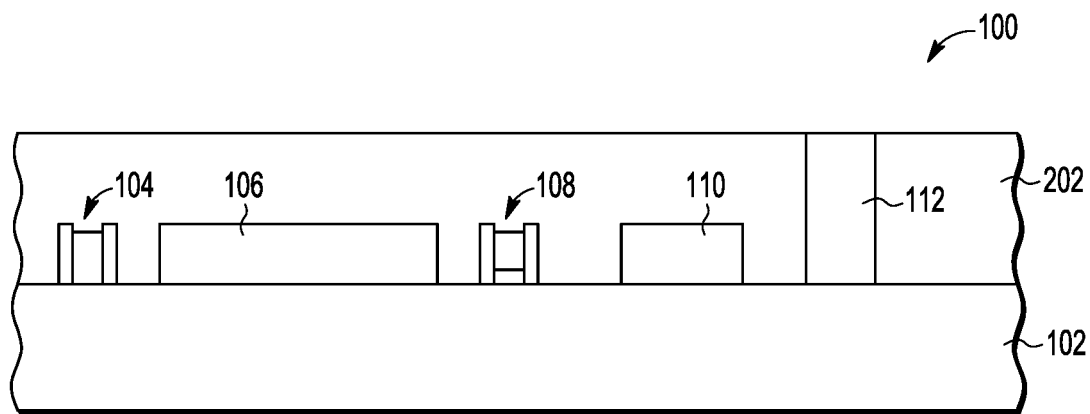
FIG. 3 is a side cross-sectional view of the packaged semiconductor device of FIG. 2 during a subsequent stage of fabrication.

FIG. 3 is a side cross-sectional view of the packaged semiconductor device 100 of FIG. 2 during a subsequent stage of fabrication in which encapsulating material 202 is removed to expose a top surface of conductive pillar 112. Since conductive pillar 112 is higher than other components on substrate 102, the top surfaces of the other components remain covered by encapsulating material 202. Encapsulating material 202 may be removed by grinding, e.g., chemical-mechanical polishing, or other suitable technique that exposes the top surface of conductive pillar 112 by removing a layer of encapsulating material 202 while allowing remaining encapsulating material 202 to cover the side surfaces of conductive pillar 112 and the top and side surfaces of active and passive components 104, 106, 108, 110.

Figure 4:
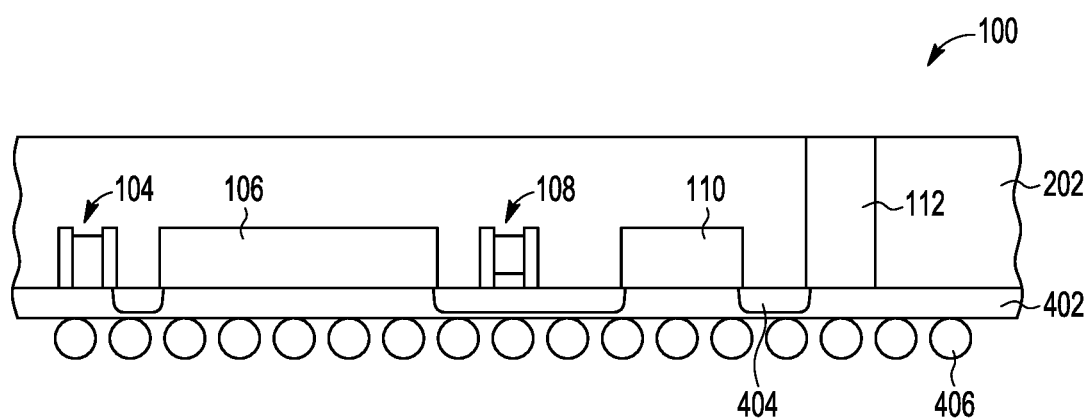
FIG. 4 is a side cross-sectional view of the packaged semiconductor device of FIG. 3 during a subsequent stage of fabrication.

FIG. 4 is a side cross-sectional view of the packaged semiconductor device 100 of FIG. 3 during a subsequent stage of fabrication in which substrate 102 is removed and a redistribution layer or interconnect layers 402 with interconnects 404 between components 104-112 are formed. In the example shown, a first interconnect 404 is shown between passive device 104 and active device 106. A second interconnect 404 is shown between active device 106 and active device 110. A third interconnect 404 is shown between active device 110 and conductive pillar 112. Interconnects 404 can be formed with conductive material embedded or layered in insulating or non-conductive material to avoid contact between interconnects 104 and external components. An array of solder balls 406 or other conductive contacts can then be formed on contact pads (not shown) that are electrically coupled to active components 106, 110.

Figure 5:
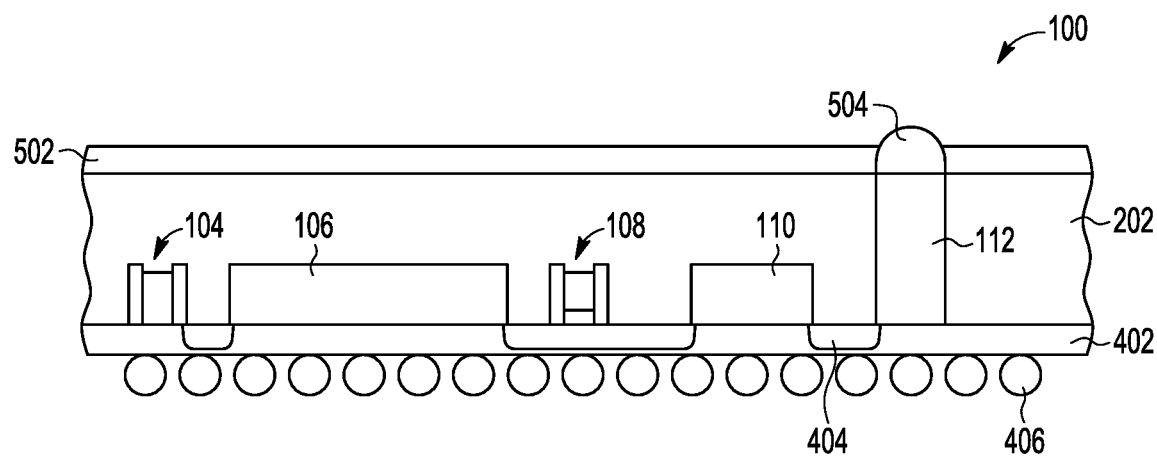
FIG. 5 is a side cross-sectional view of the packaged semiconductor device of FIG. 4 during a subsequent stage of fabrication.

FIG. 5 is a side cross-sectional view of the packaged semiconductor device 100 of FIG. 4 during a subsequent stage of fabrication during which stencil 502 is applied over the top surface of encapsulant 202. Stencil 502 has an opening over conductive pillar 112 to allow conductive solder paste or other conductive material 504 to be printed, painted or deposited over and in contact with conductive pillar 112. Stencil 502 is then removed and conductive material 504 is heated or reflowed to attach conductive material 504 to conductive pillar 112. In some embodiments, conductive material 504 can comprise an anisotropic conductive paste having a plurality of solder spheres embedded in an epoxy. Other suitable combinations of materials that provide electrical conductivity with conductive pillar 112 and can be used.

Note that the term "conductive pillar" as used in the claims can include both conductive pillar 112 and conductive material 504 attached to conductive pillar 112.

Figure 6:
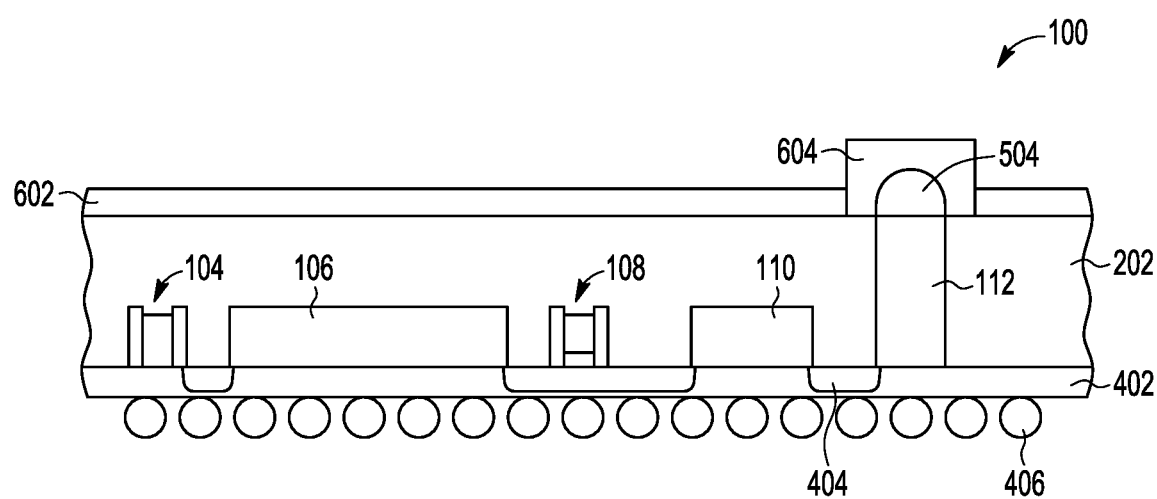
FIG. 6 is a side cross-sectional view of the packaged semiconductor device of FIG. 5 during a subsequent stage of fabrication.

FIG. 6 is a side cross-sectional view of the packaged semiconductor device 100 of FIG. 5 during a subsequent stage of fabrication during which stencil 502 (FIG. 5) is removed, and stencil 602 is applied over the top surface of encapsulant 202. Stencil 602 has an opening over conductive pillar 112 that is larger than the diameter of conductive pillar 112. Insulating material 604 is then deposited to fill the opening of stencil 602 and completely cover conductive material 504. To enable insulating material 604 to cover the top of conductive material 504, the thickness of stencil 602 above encapsulant 202 is greater than the height of conductive material 504 above encapsulant 202.

Figure 7:
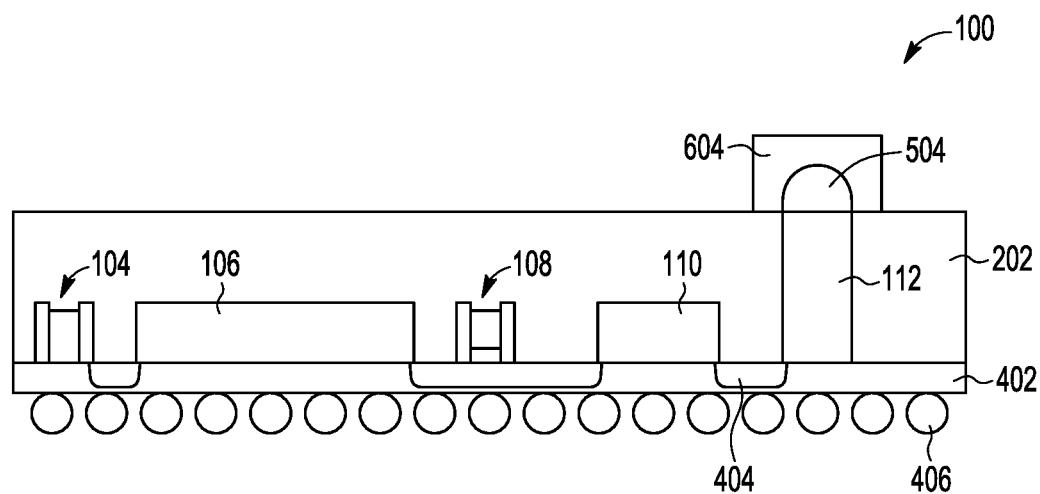
FIG. 7 is a side cross-sectional view of the packaged semiconductor device of FIG. 6 during a subsequent stage of fabrication.

FIG. 7 is a side cross-sectional view of the packaged semiconductor device 100 of FIG. 6 during a subsequent stage of fabrication during which stencil 602 is removed using conventional techniques. As an example, stencil 602 can be a metal layer supported on a frame that is brought into contact with the surface of semiconductor device 100 during the printing process. After the material is printed through the stencil apertures, stencil 602 is then lifted away from the semiconductor device 100. Conductive material 504 extending above the top surface of encapsulant 202 is surrounded by insulating material 604. In some embodiments, insulating material 604 is between 5 and 100 microns, but other suitable thicknesses can be used.

Figure 8:
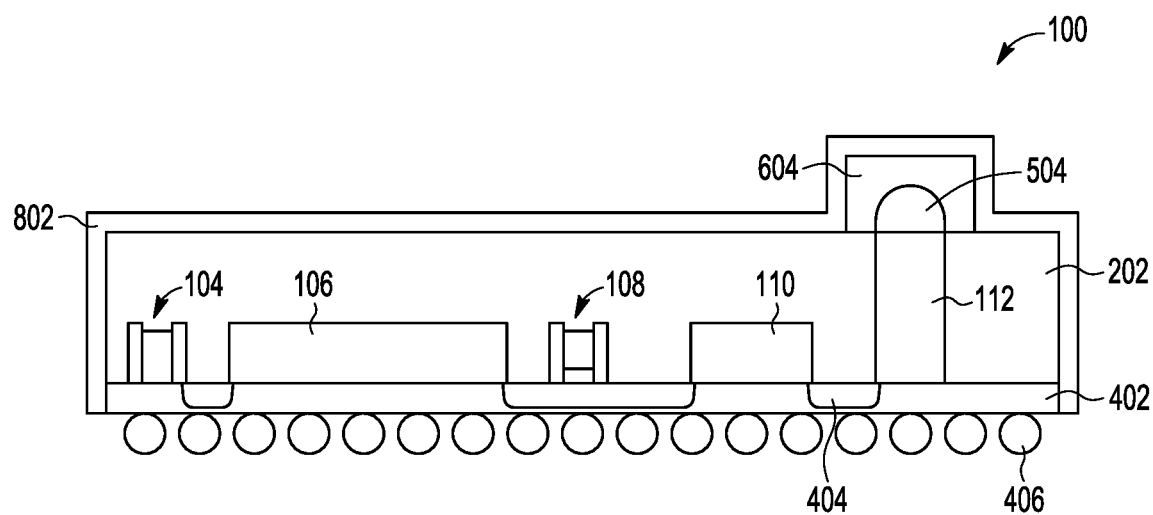
FIG. 8 is a side cross-sectional view of the packaged semiconductor device of FIG. 7 during a subsequent stage of fabrication.

FIG. 8 is a side cross-sectional view of the packaged semiconductor device 100 of FIG. 7 during a subsequent stage of fabrication during which electromagnetic shielding 802 is applied or deposited over the top and side surfaces of encapsulant 202 and insulating material 604. Shielding 802 can be made of sputtered metal, metallic ink, or other material that reduces or eliminates effects of RF electromagnetic radiation on operation of components 104-112. In some embodiments, shielding 802 includes a carrier material loaded with a suitable metal such as copper or nickel, that is sputtered or sprayed to form a continuous layer over the top and side surfaces of encapsulant 202 and insulating material 604. For example, a layer of sputtered metal that is between 1 and 10 microns thick, or a layer of paint that is 10 to 75 microns thick can be used. Other suitable materials and thicknesses can be used, however.

Figure 9:
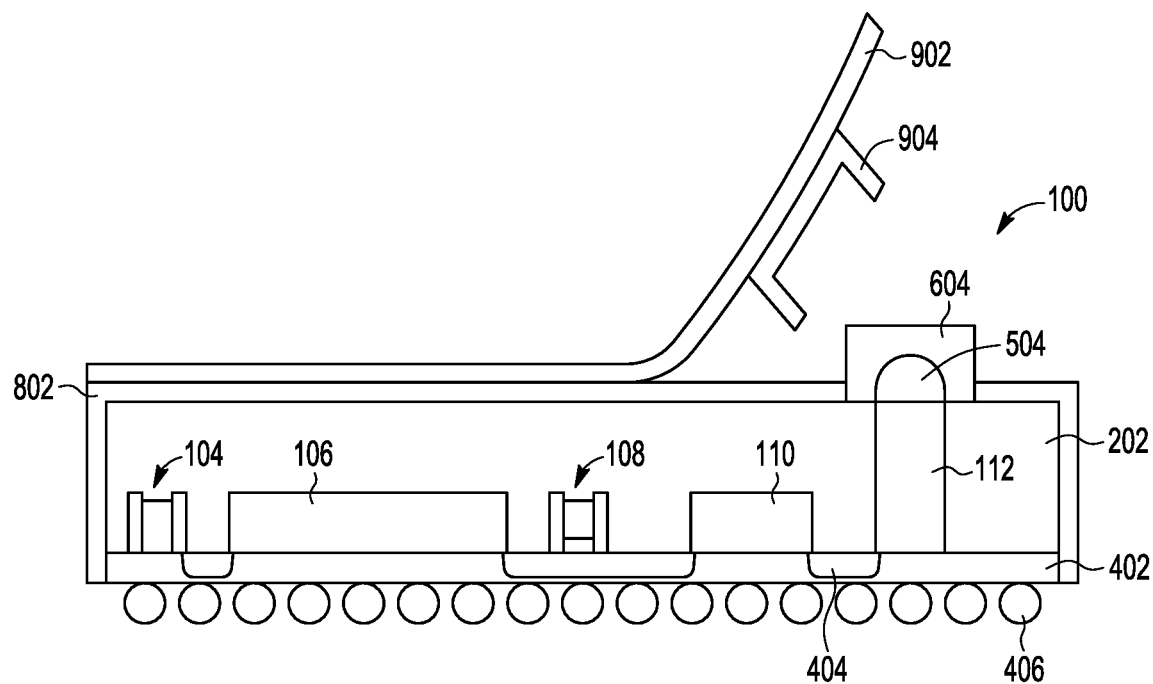
FIG. 9 is a side cross-sectional view of the packaged semiconductor device of FIG. 8 during a subsequent stage of fabrication.

FIG. 9 is a side cross-sectional view of the packaged semiconductor device 100 of FIG. 8 during a subsequent stage of fabrication during which a layer of tape 902 is applied over shielding 802 so that tape 902 specifically contacts a raised portion 904 of shielding 802 that is over insulating material 604. As tape 902 is peeled away from shielding 802, the raised portion 904 of shielding 802 over insulating material 604 detaches from shielding 802, leaving the rest of shielding 802 over the top and side surfaces of encapsulant 202. Insulating material 604 is now exposed while the top and side surfaces of encapsulant 202 remain covered with shielding 802. In selected embodiments, insulating material 604 has elasticity (e.g., a silicone, rubber, etc.) so a mechanical "roller" can be used to compress insulating material 604 and break raised portion 904 of shielding 802 at the base of the deposit.

Figure 10:
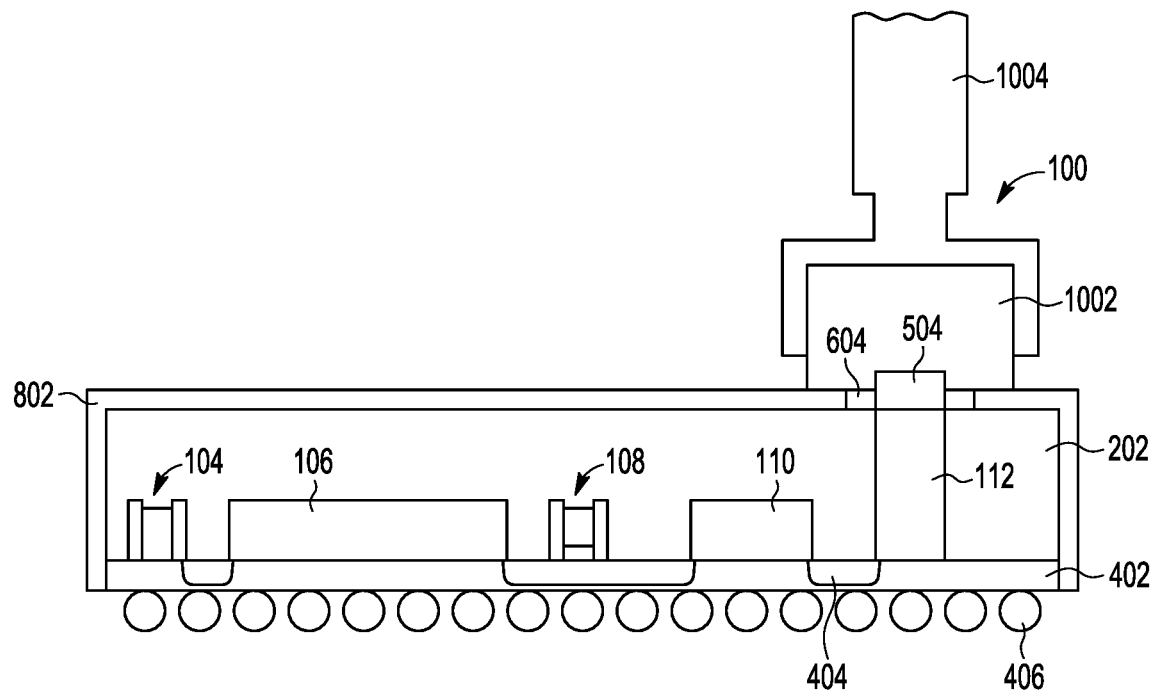
FIG. 10 is a side cross-sectional view of the packaged semiconductor device of FIG. 9 during a subsequent stage of fabrication.

FIG. 10 is a side cross-sectional view of the packaged semiconductor device 100 of FIG. 9 during a subsequent stage of fabrication during which RF connector 1002 is mounted on insulating material 604 to make electrical contact with conductive pillar 112 through conductive material 504. As connector 1002 is mounted, a portion of insulating material 604 is broken, punctured, or otherwise removed to allow an electrically conductive portion of connector 1002 to contact conductive material 504 and ultimately communicate signals to and from components 106, 110. One example of a suitable connector is a coaxial connector, such as Hirose Connector U.FL-R-SMT series connectors commercially available through Hirose Electric USA in Downers Grove, Ill., USA. Other suitable connectors can be used for connector 1002. Since insulating material 604 may be brittle, some of insulating material 604 is likely to break away as pressure is applied to mount or attach connector 1002 to be in contact with conductive material 504. Thus, no additional processing steps may be required to remove a portion of insulating material 604 before connector 1002 is attached. A portion of insulating material 604 may remain around the perimeter of conductive material 504, but does not interfere with connector 1002 making contact with conductive material 504, however. The remaining portion of insulating material 604 that remains after connector 1002 is attached forms an isolation region over encapsulant 202 around conductive material 504 such that conductive shield layer 802 is electrically isolated from conductive pillar 112 and conductive material 504. Antenna 1004 is coupled to connector 1002.

Figure 11:
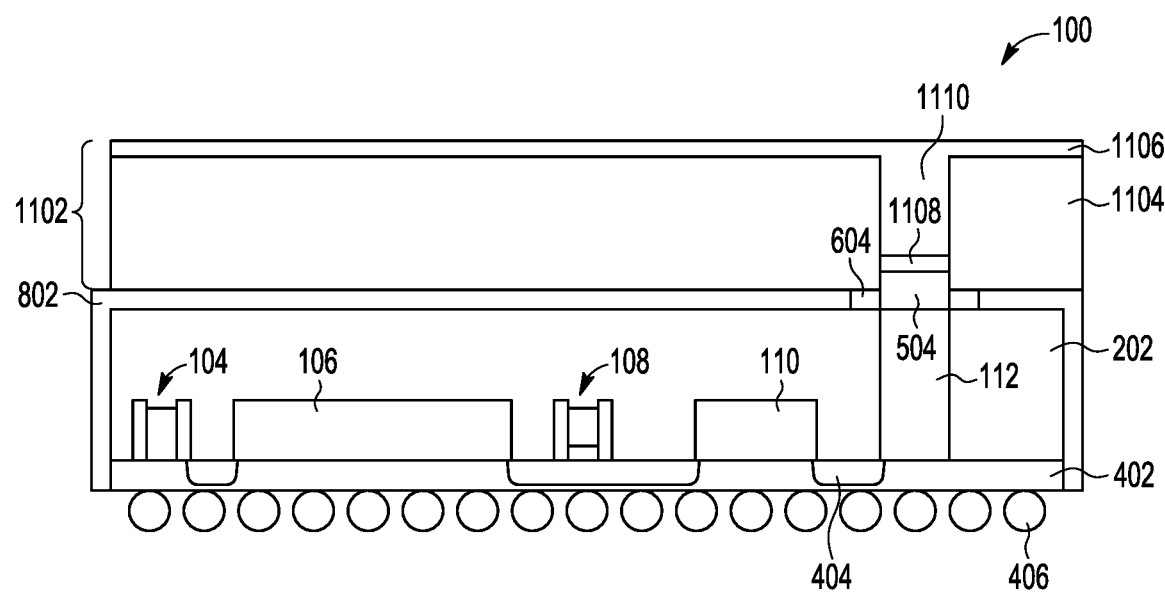
FIG. 11 is a side cross-sectional view of another embodiment of the packaged semiconductor device of FIG. 9 during a subsequent stage of fabrication.

FIG. 11 is a side cross-sectional view of another embodiment of the packaged semiconductor device 100 of FIG. 9 during a subsequent stage of fabrication in which RF connection structure 1102 is coupled to conductive material 504 instead of RF connector 1002. RF connection structure 1102 includes insulating layer 1104 such as a printed circuit board or dielectric material, RF antenna 1106 made of copper or other suitable material, and conductive pad 1108 to electrically couple conductive material 504 to a conductive via 1110 of antenna 1106. Insulating layer 1104 is formed or placed over a top surface shielding layer 802 and includes an opening over and around an upper portion of conductive material 504. Conductive pad 1108 is made of a conductive material such as copper or other suitable material and formed or deposited over the top of conductive material 504. Conductive via 1110 is in contact with conductive pad 1108 and with antenna 1106. As shown antenna 1106 has a thin, flat profile and is formed or placed over the top surface of insulating layer 1104. Antenna 1106 can extend from side to side of semiconductor device 100. Other configurations for antenna 1106 can be used, however.

Figure 12:
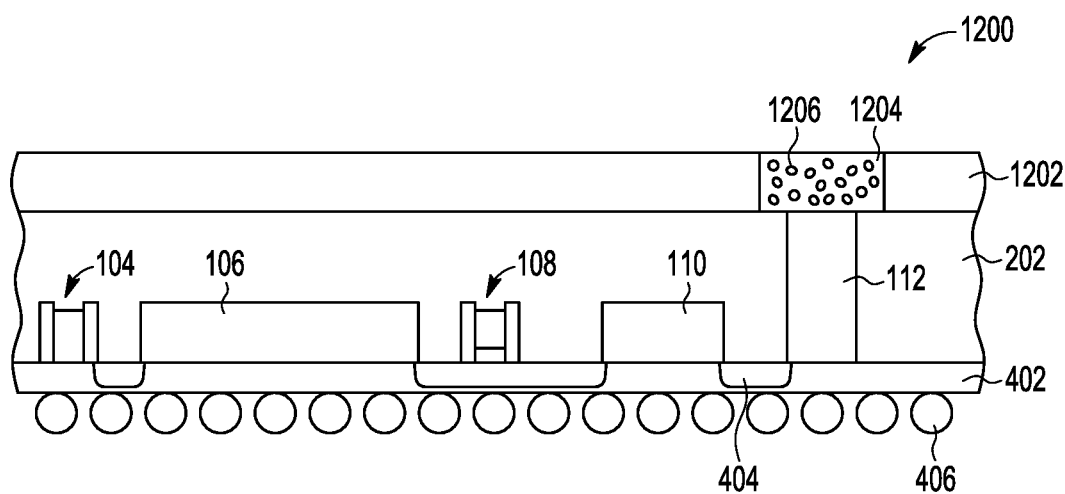
FIG. 12 is a side cross-sectional view of another embodiment of a packaged semiconductor device during an intermediate stage of fabrication.

FIG. 12 is a side cross-sectional view of another embodiment of a packaged semiconductor device 1200 during an intermediate stage of fabrication. Beginning with the semiconductor devices as shown in FIG. 4, solder stencil 1202 is formed over encapsulant 202 with an opening over conductive pillar 112. The diameter of the opening is larger than the diameter of copper pillar 112. The opening is then filled with conductive material, such as an anisotropic conductive paste (ACP) 1204, which includes an epoxy-based adhesive loaded with conductive particles 1206 (also referred to as "solder spheres") to provide electrical conductivity. Other suitable conductive material can be used instead of ACP 1204, however. Solder stencil 1202 and ACP 1204 can be between 25 and 100 microns thick. Other suitable materials and thicknesses can be used, however.

Figure 13:
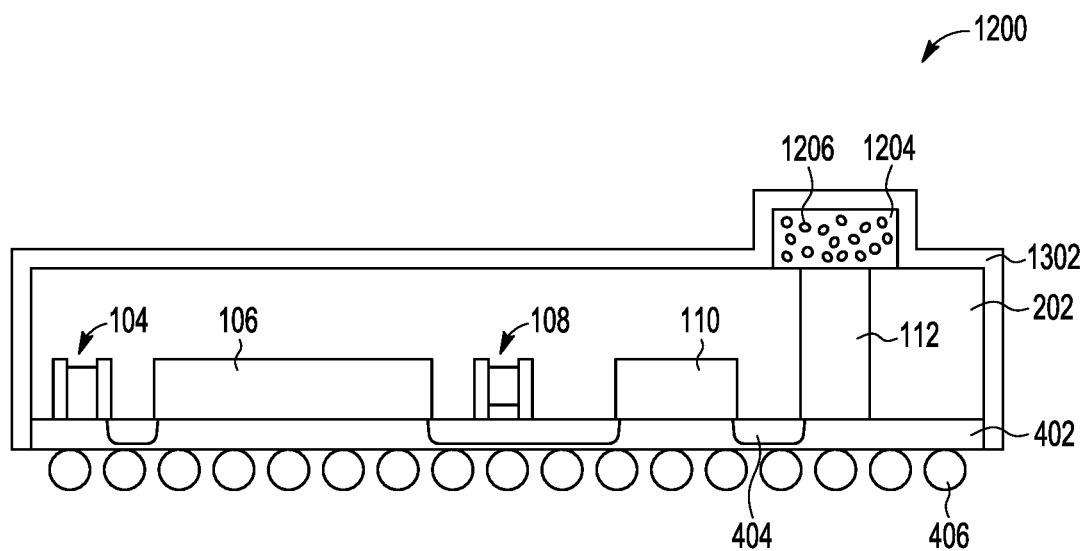
FIG. 13 is a side cross-sectional view of the packaged semiconductor device of FIG. 12 during a subsequent stage of fabrication.

FIG. 13 is a side cross-sectional view of the packaged semiconductor device 1200 of FIG. 12 during a subsequent stage of fabrication in which stencil 1202 is removed using conventional techniques and RF shielding 1302 is applied or deposited over the top and side surfaces of encapsulant 202 and insulating material 604. Shielding 802 can be made of a relatively thin layer of sputtered metal, metallic ink or other material that reduces or eliminates RF electromagnetic radiation effects on the operation of components 104-112. In some embodiments, shielding 802 includes a carrier material loaded with a suitable metal such as copper or nickel, that is sputtered or sprayed to form a continuous layer over the top and side surfaces of encapsulant 202 and ACP 1204. A layer of sputtered metal that is between 1 and 10 microns thick, or a layer of paint that is 10 to 75 microns thick can be used. Other suitable materials and thicknesses can be used, however.

Figure 14:
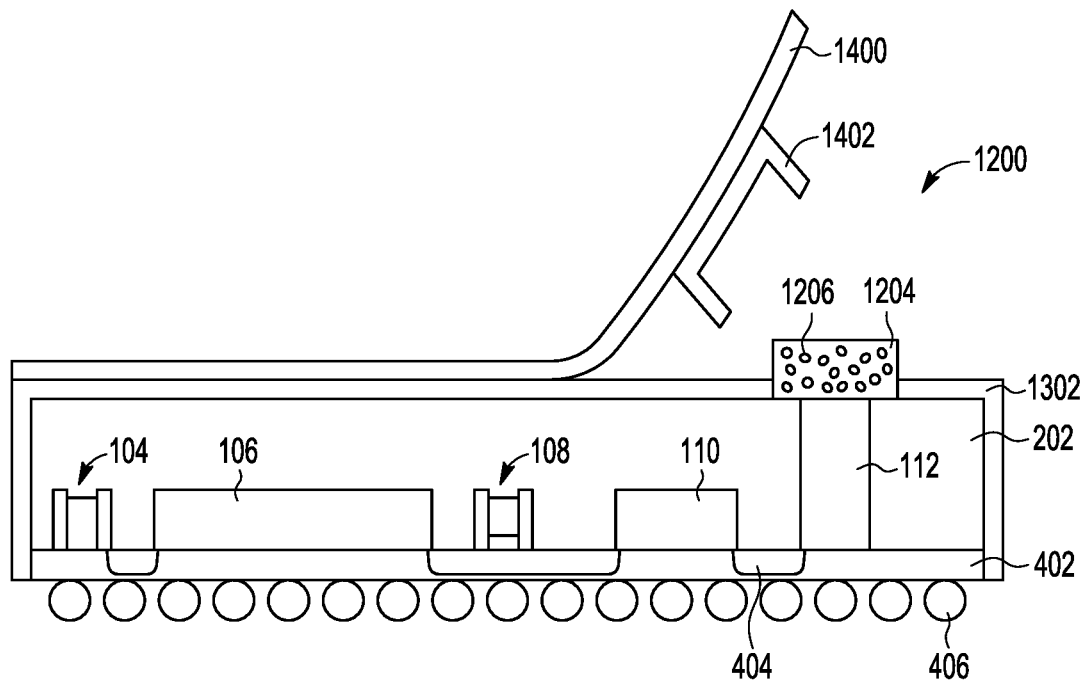
FIG. 14 is a side cross-sectional view of the packaged semiconductor device of FIG. 13 during a subsequent stage of fabrication.

FIG. 14 is a side cross-sectional view of the packaged semiconductor device 1200 of FIG. 13 during a subsequent stage of fabrication during which a layer of tape 1400 is applied over shielding 802 so that tape 1400 specifically contacts a raised portion 1402 of shielding 1302 that is over ACP 1204. As tape 1400 is peeled away from shielding 1302, the raised portion 1402 of shielding 1302 over ACP 1204 detaches from shielding 1302, leaving the rest of shielding 1302 over the top and side surfaces of encapsulant 202. ACP 1204 is now exposed while the top and side surfaces of encapsulant 202 remain covered with shielding 1302.

Figure 15:
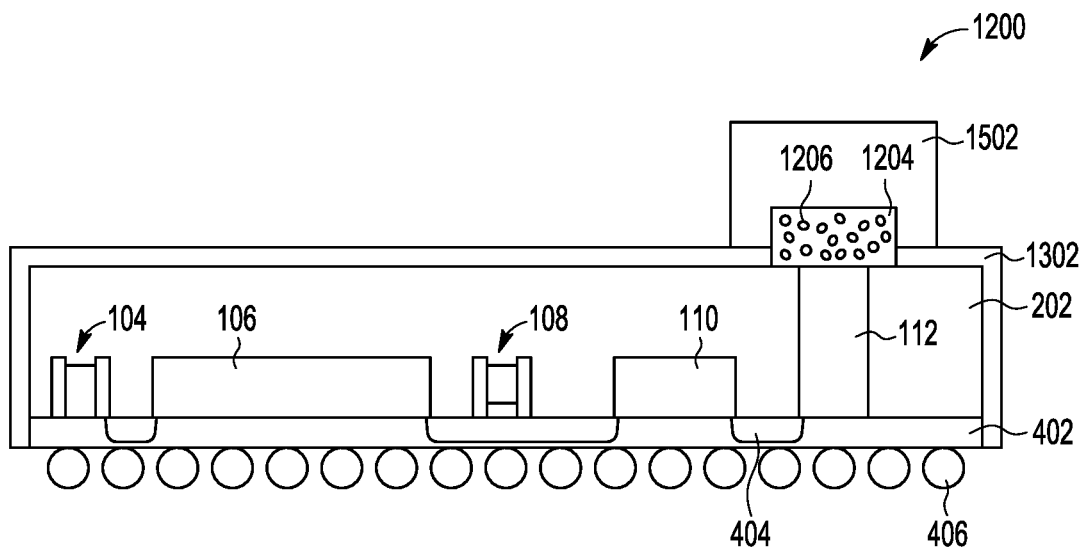
FIG. 15 is a side cross-sectional view of the packaged semiconductor device of FIG. 14 during a subsequent stage of fabrication.

FIG. 15 is a side cross-sectional view of the packaged semiconductor device 1200 of FIG. 14 during a subsequent stage of fabrication during which RF connector 1502 is mounted on ACP 1204 to make electrical contact with conductive pillar 112. One example of a suitable connector is a coaxial connector, such as Hirose Connector U.FL-R-SMT series connectors commercially available through Hirose Electric USA in Downers Grove, Ill., USA. Other suitable connectors can be used for connector 1502. A conductive pad of connector 1502 makes contact with ACP 1204. Heat is applies to connector so that solder in ACP 1204 reflows and conductive material 1260 connects the terminal or pad of connector 1502 to conductive pillar 112. The resin or epoxy in ACP 1204 cures to secure connector 1502. A portion of ACP 1204 forms an isolation region over encapsulant 202 such that conductive shield layer 1302 is electrically isolated from conductive pillar 112.

Figure 16:
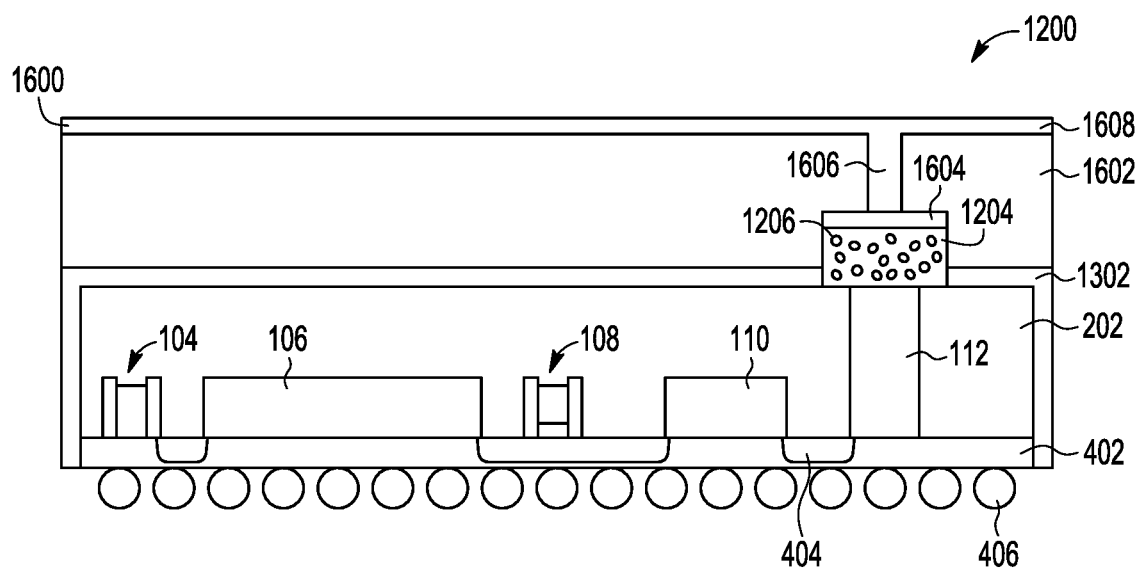
FIG. 16 is a side cross-sectional view of another embodiment of the packaged semiconductor device of FIG. 14 during a subsequent stage of fabrication.

FIG. 16 is a side cross-sectional view of another embodiment of the packaged semiconductor device 1200 of FIG. 14 during a subsequent stage of fabrication in which RF connection structure 1600 is coupled to ACP 1204. RF connection structure 1600 includes insulating layer 1602 such as a printed circuit board or dielectric material, RF antenna 1608 made of copper or other suitable material, and conductive pad 1604 to electrically couple ACP 1204 to a conductive via 1606 of antenna 1608. Insulating layer 1602 is formed or placed over a top surface shielding 1302 and includes an opening over and around ACP 1204. Conductive pad 1604 is made of a conductive material such as copper or other suitable material and formed or deposited over the top of ACP 1204. Conductive via 1606 is in contact with conductive pad 1604 and with antenna 1608. As shown antenna 1608 has a thin, flat profile and is formed or placed over the top surface of insulating layer 1602. Antenna 1608 can extend from side to side of semiconductor device 1200. Other configurations for antenna 1608 can be used, however.

Once antenna 1608 is placed on insulating layer 1602, antenna 1608, conductive via 1606, conductive pad 1604 and ACP 1204 can be heated to reflow conductive particles 1206 in ACP 1204 and make an electrical connection with antenna 1608. The resin or epoxy in ACP 1204 cures to secure conductive pad 1604. Antenna 1608, conductive via 1606, and conductive pad 1604 are also in electrical contact with one another and with conductive particles 1206 in ACP 1204. A portion of ACP 1204 forms an isolation region over encapsulant 202 such that conductive shield layer 1302 is electrically isolated from conductive pillar 112.

Figure 17:
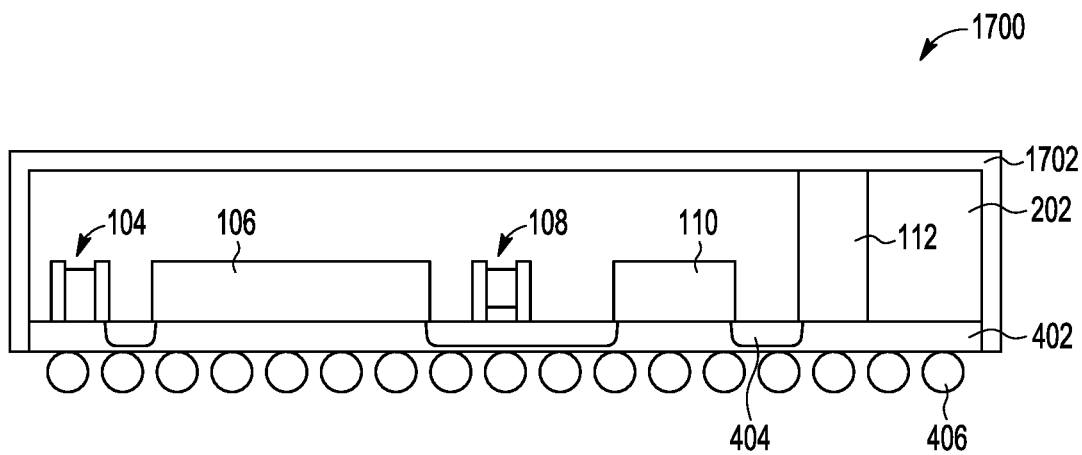
FIG. 17 is a side cross-sectional view of another embodiment of a packaged semiconductor device during an intermediate stage of fabrication.

FIG. 17 is a side cross-sectional view of another embodiment of a packaged semiconductor device 1700, similar to the packaged semiconductor device 100 of FIG. 4, during an intermediate stage of fabrication in which shield layer 1702 is applied or deposited over the top and side surfaces of encapsulant 202 and conductive pillar 112. Shielding 1702 can be made of metallic ink or other material that reduces or eliminates affects of RF electromagnetic radiation on operation of components 104-112. In some embodiments, shielding 1702 includes a carrier material loaded with a suitable metal such as copper or nickel, that is sputtered or sprayed to form a continuous layer over the top and side surfaces of encapsulant 202 and the top exposed surface of conductive pillar 112. A layer of sputtered metal that is between 1 and 10 microns thick, or a layer of paint that is 10 to 75 microns thick can be used. Other suitable materials and thicknesses can be used, however.

Figure 18:
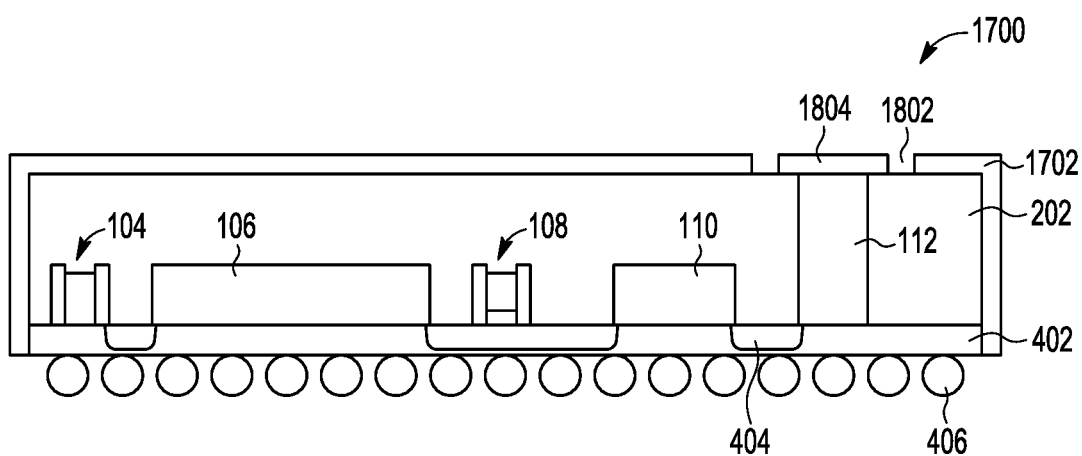
FIG. 18 is a side cross-sectional view of the packaged semiconductor device of FIG. 17 during a subsequent stage of fabrication.

FIG. 18 is a side cross-sectional view of the packaged semiconductor device 1700 of FIG. 17 during a subsequent stage of fabrication in which air gap 1802 is formed in shielding 1702 outside the entire outer perimeter of conductive via 112. An isolated portion of shielding 1702 within airgap 1802 becomes a conductive pad 1804 that remains in contact with conductive via 112 and a portion of encapsulant 202 directly adjacent to the perimeter of conductive via 112. Air gap 1802 electrically isolates conductive via 112 and conductive pad 1804 from the remaining portion of shielding 1702. In selected embodiments, air gap 1802 is between 10 and 100 microns wide, however, other suitable widths can be used.

Figure 19:
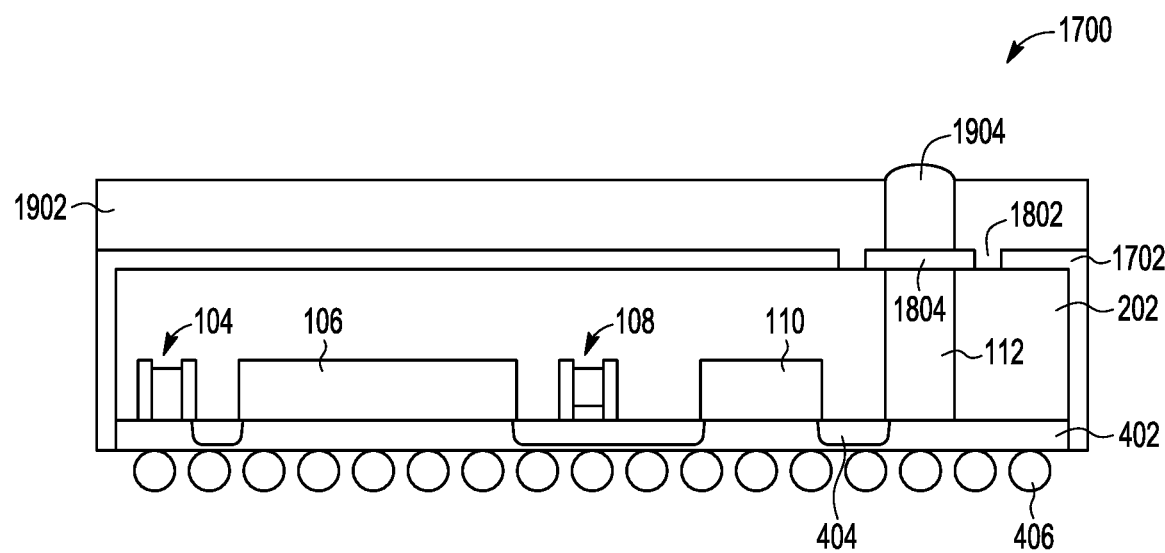
FIG. 19 is a side cross-sectional view of the packaged semiconductor device of FIG. 18 during a subsequent stage of fabrication.

FIG. 19 is a side cross-sectional view of the packaged semiconductor device of FIG. 18 during a subsequent stage of fabrication in which stencil 1902 is deposited over shielding 1702, conductive pad 1804, and within air gap 1802. An opening in stencil 1902 is formed over conductive pad 1804, within the perimeter of conductive pad 1804. Electrically conductive adhesive 1904 is deposited in the opening in stencil 1902 and includes electrically conductive materials suspended in a resin or other adhesive material.

Figure 20:
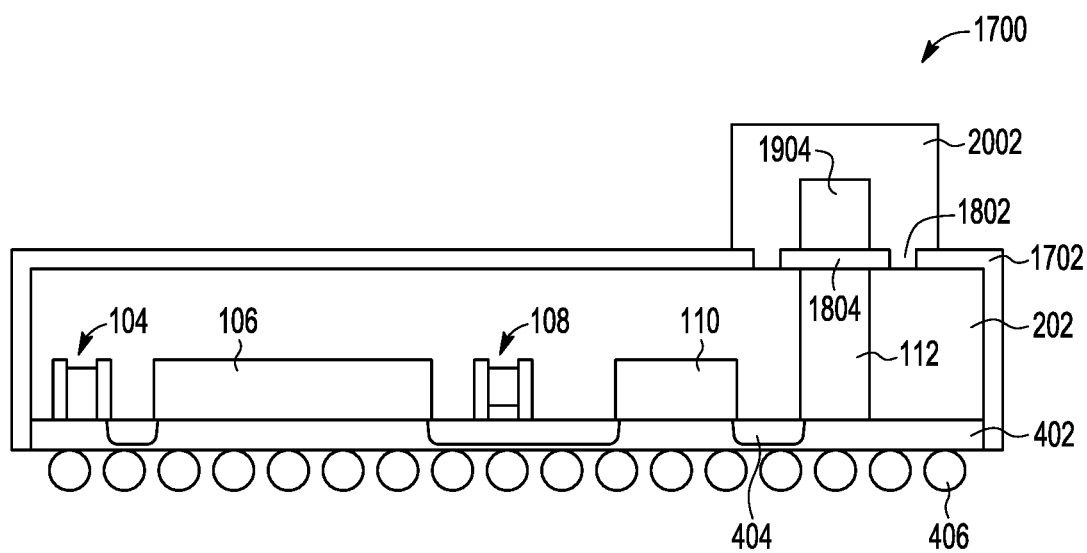
FIG. 20 is a side cross-sectional view of the packaged semiconductor device of FIG. 19 during a subsequent stage of fabrication.

FIG. 20 is a side cross-sectional view of the packaged semiconductor device 1700 of FIG. 19 during a subsequent stage of fabrication in which stencil 1902 is removed, connector 2002 is placed on electrically conductive adhesive 1904, and electrically conductive adhesive 1904 has cured. An electrical connection is formed between connector 2002, electrically conductive adhesive 1904, conductive pad 1804 conductive pillar 112, and ultimately, one or more of components 104-110.

Figure 21:
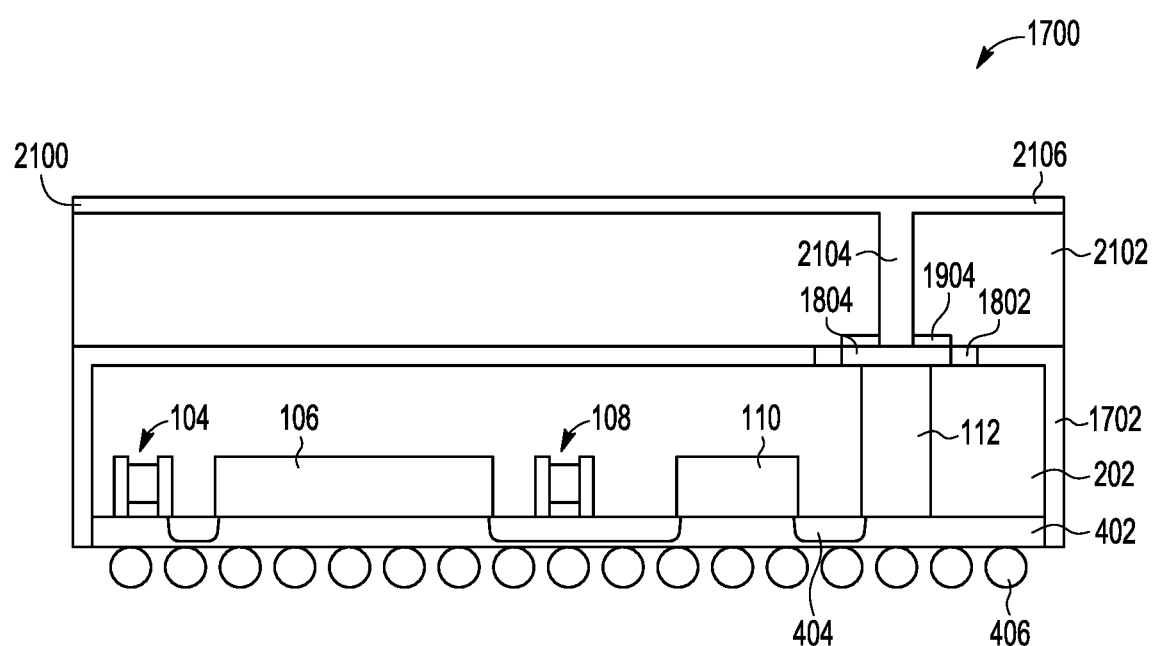
FIG. 21 is a side cross-sectional view of the packaged semiconductor device of FIG. 18 during a subsequent stage of fabrication.

FIG. 21 is a side cross-sectional view of the packaged semiconductor device 1700 of FIG. 18 during a subsequent stage of fabrication in which RF connection structure 2100 is coupled to electrically conductive adhesive 1904 and conductive pad 1804. RF connection structure 2100 includes insulating layer 2102 such as a printed circuit board or dielectric material, and RF antenna 2106 made of copper or other suitable material. Conductive pad 1904 is electrically coupled to conductive via 2104 of antenna 2106. Insulating layer 2102 is formed or placed over a top surface shielding 1702 and includes an opening over electrically conductive adhesive 1904. Conductive via 2104 is in contact with conductive pad 1904 and with antenna 2106. As shown antenna 2106 has a thin, flat profile and is formed or placed over the top surface of insulating layer 2102. Antenna 2106 can extend from side to side of semiconductor device 100. Other configurations for antenna 2106 can be used, however.

By now it should be appreciated that in selected embodiments, there has been provided a semiconductor structure (100, 1200, 1700), that can comprise a packaged semiconductor device having at least one device (104, 106, 108, 112), a conductive pillar (112), and an encapsulant (202, etc.) over the at least one device and surrounding the conductive pillar. The conductive pillar extends from a first major surface of the encapsulant to a second major surface of the encapsulant, opposite the first major surface, and is exposed at the second major surface of the encapsulant and the at least one device is exposed at the first major surface of the encapsulant. A conductive shield layer (802, 1302, 1702) is on the second major surface of the encapsulant and on minor surfaces of the encapsulant. An isolation region (604, 1802, and in FIGS. 15 and 16) configured to electrically isolate that the conductive shield layer from the conductive pillar. A radio-frequency (RF) connection structure (1002, 1104, 1502, 1602, 2002, 2102) over and in electrical contact with the conductive pillar at the second major surface of the encapsulant.

In another aspect, the packaged semiconductor device comprises at least one interconnect layer (402) on the first major surface of the encapsulant and a plurality of package interconnects, wherein the at least one interconnect layer routes (404) signals from the at least one device to the plurality of package interconnects (406).

In another aspect, the isolation region surrounds the conductive pillar at the second major surface of the encapsulant.

In another aspect, the isolation region comprises an insulating material (604 or epoxy of 1204).

In another aspect, the isolation region comprises an air gap (1802).

In another aspect, the semiconductor structure can further comprise a solder joint (504, 1206) wherein the RF connection structure is in electrical contact with the conductive pillar via the solder joint.

In another aspect, a portion of the conductive shield layer (1702) can be over the conductive pillar exposed at the second surface of the encapsulant, the structure further comprising an electrically conductive adhesive over the portion of the conductive shield layer, wherein the RF connection structure is in electrical contact with the conductive pillar via the electrically conductive adhesive and the portion of the conductive shield layer.

In another aspect, the RF connection structure can comprise one of an antenna connection (1002) or a substrate comprising an antenna (1104).

In another aspect, the conductive pillar can comprise a pre-placed via (PPV) (112).

In other selected embodiments, a method for forming a semiconductor structure (100 or 1200) can comprise forming an encapsulant (202) over a device and surrounding a conductive pillar (112), wherein the conductive pillar extends from a first major surface of the encapsulant to a second major surface of the encapsulant, opposite the first major surface, and is exposed at the second major surface of the encapsulant and the at least one device is exposed at the first major surface of the encapsulant. A redistribution layer (402) can be formed on the first major surface of the encapsulant and the exposed device. A conductive paste (504, 1204) can be applied on the exposed conductive pillar at the second surface of the encapsulant. A shield layer (802, 1302) can be applied over the second major surface of the encapsulant. The shield layer can be electrically isolated from the conductive pillar by an isolation region (604 or epoxy of 1204). A radio-frequency (RF) connection structure can be attached over the conductive pillar such that the RF connection structure is in electrical contact with the conductive pillar at the second major surface of the encapsulant.

In another aspect, applying the conductive paste comprises stencil printing (502, 1202) the conductive paste.

In another aspect, the conductive paste can comprise an anisotropic conductive paste having a plurality of solder spheres embedded in an epoxy and wherein the shield layer is formed over the conductive paste. The method can further comprise applying a tape (1400) to the shield layer; and removing the tape to remove a portion (1402) of the shield layer covering the conductive paste.

In another aspect, attaching the RF connection structure can comprise applying heat (FIGS. 15 and 16) such that the RF structure is in electrical contact with the conductive pillar via the solder spheres, and the isolation region comprises the epoxy.

In another aspect, the method can further comprise forming an insulating material (604) over the conductive paste, wherein the shield layer is formed over the insulating material, applying tape to the shield layer (900), and removing the tape to remove a portion (904) of the shield layer covering the insulating material.

In another aspect, applying the conductive paste can comprise stencil printing the conductive paste using a first stencil (502) and forming the insulting material comprises stencil printing the insulating material using a second stencil (802).

In another aspect, attaching the RF connection structure can comprise applying pressure with the RF connection structure (FIGS. 10 and 11) to break through the insulating material over the exposed conductive pillar such that the RF structure is in electrical contact with the conductive pillar via the conductive paste.

In another aspect, prior to forming the shield layer, the encapsulant can be singulated to form singulated packaged devices, wherein the shield layer is also formed on minor surfaces of the singulated encapsulant.

In further selected embodiments, a method for forming a semiconductor structure (1700) can comprise forming an encapsulant (202) over a device and surrounding a conductive pillar (112), wherein the conductive pillar extends from a first major surface of the encapsulant to a second major surface of the encapsulant, opposite the first major surface, and is exposed at the second major surface of the encapsulant and the at least one device is exposed at the first major surface of the encapsulant. A redistribution layer (402) can be formed on the first major surface of the encapsulant and the exposed device. The encapsulant can be signulated to form a singulated packaged device (as in FIG. 17) having the device and conductive pillar. A shield layer (1702) can be formed over the second major surface and minor surfaces of the encapsulant of the singulated package device. The shield layer (1802) can be cut at the second major surface of the encapsulant of the singulated package device to form a first portion (1702) of the shield layer that is electrically isolated from the conductive pillar and a second portion (1702 on top of 112) of the shield layer that remains over the conductive pillar. An electrically conductive adhesive (1904) can be applied to the second portion of the shield layer. A radio-frequency (RF) connection structure can be attached over the conductive pillar such that the RF connection structure is in electrical contact with the conductive pillar via the electrically conductive adhesive and second portion of the shield layer.

In another aspect, applying the electrically conductive adhesive can comprise stencil printing (1902) the electrically conductive adhesive.

In another aspect, the RF connection structure can be connected to result in an air gap (1802) between the first portion of the shield layer and the second portion of the shield layer, wherein the air gap surrounds the conductive pillar at the second major surface of the encapsulant of the packaged semiconductor device.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a packaged semiconductor device, comprising:

encapsulating at least one semiconductor component and a conductive pillar with an encapsulant, wherein the conductive pillar extends from a first major surface of the encapsulant to a second major surface of the encapsulant, opposite the first major surface, and is exposed at the second major surface of the encapsulant and the at least one semiconductor component is exposed at the first major surface of the encapsulant, forming a conductive shield layer on the second major surface of the encapsulant and on minor surfaces of the encapsulant;

forming an isolation region configured to electrically isolate that the conductive shield layer from the conductive pillar;

forming a solder joint wherein the RF connector is in electrical contact with the conductive pillar via the solder joint; and attaching a radio-frequency (RF) connector over and in electrical contact with the conductive pillar at the second major surface of the encapsulant, wherein the RF connector is configured to couple to an antenna.

2. The method of claim 1, wherein the packaged semiconductor device comprises at least one interconnect layer on the first major surface of the encapsulant and a plurality of package interconnects, wherein the at least one interconnect layer routes signals from the at least one semiconductor component to the plurality of package interconnects.

3. The method of claim 1, wherein the isolation region surrounds the conductive pillar at the second major surface of the encapsulant.

4. The method of claim 3, wherein the isolation region comprises an insulating material.

5. The method of claim 3, wherein the isolation region comprises an air gap.

6. The method of claim 1 wherein a portion of the conductive shield layer is over the conductive pillar exposed at the second surface of the encapsulant, the method further comprising applying an electrically conductive adhesive over the portion of the conductive shield layer, wherein the RF connector is in electrical contact with the conductive pillar via the electrically conductive adhesive and the portion of the conductive shield layer.

7. The method of claim 1, wherein the conductive pillar comprises a pre-placed via (PPV).

8. A method for forming a semiconductor structure, comprising:

forming an encapsulant over a device and surrounding a conductive pillar, wherein the conductive pillar extends from a first major surface of the encapsulant to a second major surface of the encapsulant, opposite the first major surface, and is exposed at the second major surface of the encapsulant and the at least one device is exposed at the first major surface of the encapsulant;

forming a redistribution layer on the first major surface of the encapsulant and the exposed device;

applying a conductive paste on the exposed conductive pillar at the second surface of the encapsulant;

forming a shield layer over the second major surface of the encapsulant, wherein the shield layer is electrically isolated from the conductive pillar by an isolation region; and attaching a radio-frequency (RF) connector over the conductive pillar such that the RF connector is in electrical contact with the conductive pillar at the second major surface of the encapsulant, and the RF connector is configured to couple to an antenna.

9. The method of claim 8, wherein applying the conductive paste comprises stencil printing the conductive paste.

10. The method of claim 8, wherein the conductive paste comprises an anisotropic conductive paste having a plurality of solder spheres embedded in an epoxy and wherein the shield layer is formed over the conductive paste, the method further comprises:

applying a tape to the shield layer; and removing the tape to remove a portion of the shield layer covering the conductive paste.

11. The method of claim 10, wherein attaching the RF connector comprises applying heat such that the RF connector is in electrical contact with the conductive pillar via the solder spheres, and the isolation region comprises the epoxy.

12. The method of claim 8, further comprising:

forming an insulating material over the conductive paste, wherein the shield layer is formed over the insulating material;

applying tape to the shield layer; and removing the tape to remove a portion of the shield layer covering the insulating material.

13. The method of claim 12, wherein applying the conductive paste comprises stencil printing the conductive paste using a first stencil and forming the insulting material comprises stencil printing the insulating material using a second stencil.

14. The method of claim 12, wherein attaching the RF connector comprises:

applying pressure with the RF connector to break through the insulating material over the exposed conductive pillar such that the RF connector is in electrical contact with the conductive pillar via the conductive paste.

15. The method of claim 8, wherein prior to forming the shield layer, singulating the encapsulant to form singulated packaged devices, wherein the shield layer is also formed on minor surfaces of the singulated encapsulant.

16. A method for forming a semiconductor structure, comprising:

forming an encapsulant over a device and surrounding a conductive pillar, wherein the conductive pillar extends from a first major surface of the encapsulant to a second major surface of the encapsulant, opposite the first major surface, and is exposed at the second major surface of the encapsulant and the at least one device is exposed at the first major surface of the encapsulant;

forming a redistribution layer on the first major surface of the encapsulant and the exposed device;

singulating the encapsulant to form a singulated packaged device having the device and conductive pillar;

forming a shield layer over the second major surface and minor surfaces of the encapsulant of the singulated package device;

cutting the shield layer at the second major surface of the encapsulant of the singulated package device to form a first portion of the shield layer that is electrically isolated from the conductive pillar and a second portion of the shield layer that remains over the conductive pillar;

applying an electrically conductive adhesive to the second portion of the shield layer; and attaching a radio-frequency (RF) connector over the conductive pillar such that the RF connector is in electrical contact with the conductive pillar via the electrically conductive adhesive and second portion of the shield layer, and the RF connector is configured to couple to an antenna.

17. The method of claim 16, wherein applying the electrically conductive adhesive comprises stencil printing the electrically conductive adhesive.

18. The method of claim 16, wherein attaching the RF connector results in an air gap between the first portion of the shield layer and the second portion of the shield layer, wherein the air gap surrounds the conductive pillar at the second major surface of the encapsulant of the packaged semiconductor device.

* * * * *